United States Patent
Jung et al.

(10) Patent No.: US 8,390,187 B2
(45) Date of Patent: Mar. 5, 2013

(54) HIGH-TRANSPARENCY POLARIZING PLATE AND ORGANIC LIGHT EMITTING DEVICE INCLUDING THE SAME

(75) Inventors: Wook-Suk Jung, Yongin (KR); Soon-Ryong Park, Yongin (KR); Chul-Woo Jeong, Yongin (KR); Hee-Seong Jeong, Yongin (KR); Tae-Kyu Kim, Yongin (KR); Sung-Soo Koh, Yongin (KR); Il-Ryong Cho, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 12/862,463

(22) Filed: Aug. 24, 2010

(65) Prior Publication Data

US 2011/0204767 A1 Aug. 25, 2011

(30) Foreign Application Priority Data

Feb. 24, 2010 (KR) .................. 10-2010-0016664

(51) Int. Cl.
*H01J 1/62* (2006.01)
*G02B 5/30* (2006.01)
*G02B 5/22* (2006.01)

(52) U.S. Cl. ........................... 313/498; 313/504
(58) Field of Classification Search .......... 313/498–512; 428/690
See application file for complete search history.

(56) References Cited

U.S. PATENT DOCUMENTS

| | | | |
|---|---|---|---|
| 2009/0033839 A1* | 2/2009 | Fukuda | 349/102 |
| 2009/0079913 A1* | 3/2009 | Nishikawa et al. | 349/106 |
| 2009/0103013 A1* | 4/2009 | Taguchi | 349/96 |
| 2009/0122233 A1* | 5/2009 | Kondou | 349/75 |
| 2009/0135344 A1* | 5/2009 | Suzuki et al. | 349/96 |
| 2009/0153783 A1* | 6/2009 | Umemoto | 349/96 |
| 2009/0159345 A1* | 6/2009 | Kobayashi et al. | 178/18.09 |
| 2009/0166583 A1* | 7/2009 | Hasegawa et al. | 252/299.62 |
| 2009/0174844 A1* | 7/2009 | Li et al. | 349/75 |
| 2009/0180056 A1* | 7/2009 | Ohsawa et al. | 349/75 |
| 2009/0180059 A1* | 7/2009 | Fukuda et al. | 349/96 |
| 2010/0320494 A1 | 12/2010 | Kim et al. | |

FOREIGN PATENT DOCUMENTS

| | | |
|---|---|---|
| JP | 2002-022950 A | 1/2002 |
| JP | 2002-40233 A | 2/2002 |
| JP | 2005-049698 | 2/2005 |
| JP | 2008-059836 | 3/2008 |
| JP | 2011-512558 | 4/2011 |
| KR | 10-2004-0099070 A | 11/2004 |
| KR | 10-2005-0039525 A | 4/2005 |
| KR | 10-2006-0060170 A | 6/2006 |
| KR | 10-2006-0084168 A | 7/2006 |
| KR | 10-2006-0127325 A | 12/2006 |
| KR | 10-2007-0022172 A | 2/2007 |
| KR | 10-2009-0122138 A | 11/2009 |

* cited by examiner

OTHER PUBLICATIONS

Korean Office action issued by Korean Industrial Property Office on Aug. 22, 2011, corresponding to KR 10-2010-0016664 and Request for Entry attached herewith.

*Primary Examiner* — Anh Mai
*Assistant Examiner* — Elmito Breval
(74) *Attorney, Agent, or Firm* — Robert E. Bushnell, Esq.

(57) ABSTRACT

A polarizing plate including a polarizing film, a retardation film, and a color adhesive layer disposed between the polarizing film and the retardation film, and an organic light-emitting device including the polarizing plate. The color adhesive layer may include a first dye that absorbs a first light beam having a peak wavelength of about 470 to about 510 nm, a second dye that absorbs a second light beam having a peak wavelength of about 540 to about 610 nm, and a binder.

19 Claims, 3 Drawing Sheets

HIGH-TRANSPARENCY POLARIZING PLATE AND ORGANIC LIGHT EMITTING DEVICE INCLUDING THE SAME

CLAIM OF PRIORITY

This application claims the benefit of Korean Patent Application No. 10-2010-0016664, filed on Feb. 24, 2010, in the Korean Intellectual Property Office, the disclosure of which is incorporated herein in its entirety by reference.

BACKGROUND OF THE INVENTION

1. Field of the Invention

The present invention relates to a high-transparency polarizing plate including a polarizing film, a retardation film, and a color adhesive film disposed between the polarizing film and the retardation film, and an organic light-emitting device including the high-transparency polarizing plate.

2. Description of the Related Art

Typically, an organic light-emitting device includes an anode, a cathode and an organic layer interposed between the anode and the cathode. In the organic light-emitting device, as a voltage is applied between the anode and the cathode, holes are injected from the anode to the organic layer, while electrons are injected from the cathode to the organic layer. The holes and electrons injected into the organic layer combine to generate exitons. When the exitons drop from an excitation state into a ground state, light is emitted.

In the organic light-emitting device, the anode constitutes a reflective electrode, whereas the cathode constitutes a transparent electrode. Thus, when the organic light-emitting device operates, light emitted from the organic layer is reflected from the reflective electrode and is externally emitted by passing through the transparent electrode.

In this regard, nearly 100% of internal light is externally emitted, whereas about 40% of external light is reflected. As a result, an image may appear incomplete. In particular, dark colors of the image may not be sufficiently discernable, so that the contrast ratio and visibility of the image may be lowered. Thus, a polarizing plate may be attached to an external surface of the organic light-emitting device in order to reduce the reflection of external light. The polarizing plate is disposed on an external surface of a substrate of the organic light-emitting device and has a stacked structure including a retardation film, a first base layer, a polarizing film and a second base layer, which are sequentially disposed on the external surface of the substrate.

Reflectance of external light may be lowered to about 4% due to the attachment of the polarizing plating having the structure described above. However, transmittance of the internal light may also be lowered to about 43%, thereby causing loss of light. Therefore, there is a need to reduce such loss of light and, the increased power to consumption that is necessary due to the higher-luminance light-emitting device.

SUMMARY OF THE INVENTION

The present invention provides a polarizing plate having a novel structure.

The present invention provides an organic light-emitting device including the polarizing plate.

According to an aspect of the present invention, there is provided a polarizing plate including: a polarizing film; a retardation film; and a color adhesive layer disposed between the polarizing film and the retardation film, wherein the color adhesive layer includes a first dye that absorbs a first light beam having a peak wavelength of about 470 to about 510 nm, a second dye that absorbs a second light beam having a peak wavelength of about 540 to about 610 nm, and a binder.

The color adhesive layer may have a transmittance of 50% or less with respect to the first light beam. The color adhesive layer may have a transmittance of 50% or less with respect to the second light beam.

The first dye may include at least one dye selected from the group consisting of an anthraquinone-based dye, a methine-based dye, an azomethine-based dye, an oxadine-based dye, an azo-based dye, a styryl-based dye, a coumarin-based dye, a porphyrin-based dye, a dibenzofuranone-based dye, a diketopyrrolopyrrole-based dye, a rhodamine-based dye, a xanthene-based dye and a pyrromethene-based dye.

The second dye may include at least one dye selected from the group consisting of an anthraquinone-based dye, a methine-based dye, an azomethine-based dye, an oxadine-based dye, an azo-based dye, a styryl-based dye, a coumarin-based dye, a porphyrin-based dye, a dibenzofuranone-based dye, a diketopyrrolopyrrole-based dye, a rhodamine-based dye, a xanthene-based dye and a pyrromethene-based dye.

The binder may include at least one material selected from the group consisting of an acryl-based polymer, a silicon-based polymer, an ester-based polymer, a urethane-based polymer, an amide-based polymer, an ether-based polymer, a fluor-based polymer, and a rubber.

The polarizing film may include a matrix, iodine, and a third dye.

The polarizing film may have a multi-layered structure including a first polarizing film and a second polarizing film, wherein the first polarizing film may include a matrix and iodine, and the second polarizing film may include a matrix and a third dye.

According to another aspect of the present invention, there is provided a polarizing film including: a polarizing film; a first base layer; a second base layer; a retardation film; and a color adhesive layer disposed between the polarizing film and the retardation film, wherein the color adhesive layer may include a first dye that absorbs light having a peak wavelength of about 470 to about 510 nm, a second dye that absorbs light having a peak wavelength of about 540 to about 610 nm, and a binder, and the first base layer may be disposed between the color adhesive layer and the polarizing film, and the second base layer may be disposed on a surface of the polarizing film opposite to the first base layer.

The first base layer and the second base layer may include tri-acetyl-cellulose (TAC).

The polarizing plate may further include an adhesive layer, wherein the adhesive layer, the retardation film, the color adhesive layer, the first base layer, the polarizing film and the second base layer may be stacked upon one another in that order.

According to another aspect of the present invention, there is provided a polarizing plate including: a first polarizing film; a second polarizing film; a first base layer; a second base layer; a retardation film; and a color adhesive layer disposed between the first polarizing film and the retardation film, wherein the color adhesive layer may include a first dye that absorbs a first light beam having a peak wavelength of about 470 to about 510 nm, a second dye that absorbs a second light beam having a peak wavelength of about 540 to about 610 nm, and a binder. The first base layer may be disposed between the first polarizing film and the second polarizing film, and the second base layer may be disposed on a surface of the second polarizing film opposite to the first base layer.

The polarizing plate may further include an adhesive layer, wherein the adhesive layer, the retardation film, the color adhesive layer, the first polarizing film, the first base layer, the second polarizing film and the second base layer may be stacked upon one another in this order.

According to another aspect of the present invention, there is provided an organic light-emitting device including: a substrate on which an organic light-emitting element is disposed; and a polarizing plate located in an optical path of light emitted from the organic light-emitting element, the polarizing plate being the polarizing plate described above.

Assuming that an intensity of a first light beam having a peak wavelength of 470 to 510 nm emitted from the organic light-emitting element is A, and an intensity of the first light beam that has passed through the polarizing plate after being emitted from the organic light-emitting element is B, B/A× 100(%) may be equal to or less than 50%. Assuming that an intensity of a second light beam having a peak wavelength of 540 to 610 nm emitted from the organic light-emitting element is C, and an intensity of the second light beam that has passed through the polarizing plate after being emitted from the organic light-emitting element is D, D/C×100(%) may be equal to or less than 50%.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Reference will now be made in detail to the exemplary embodiments of the present invention, examples of which are illustrated in the accompanying drawings.

Figure 1:
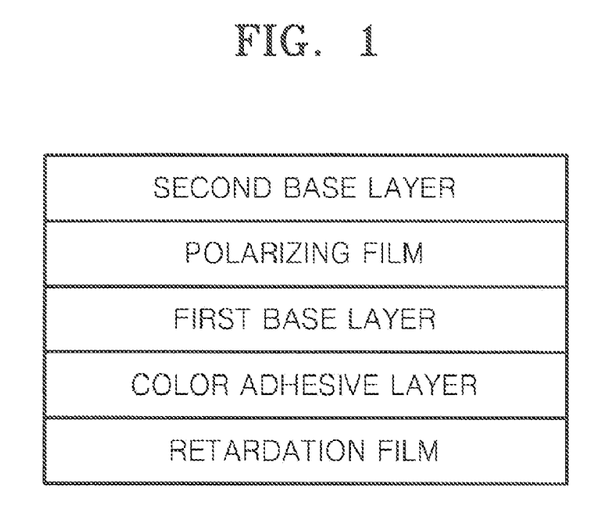
FIG. 1 is a cross-sectional view of a polarizing plate according to an embodiment of the present invention.

FIG. 1 is a cross-sectional view of a polarizing plate according to an embodiment of the present invention.

Referring to FIG. 1, the polarizing plate includes a polarizing film, a retardation film, and a color adhesive layer disposed between the polarizing film and the retardation film.

In general, the retardation film may be a $\lambda/4$ retardation film. The $\lambda/4$ retardation film converts linear polarized light into circular polarized light, or circular polarized light into linear polarized light by inducing a phase difference of $\lambda/4$ between two polarized components that are parallel to an optical axis of the retardation film and are perpendicular to each other.

The retardation film may convert internal light being emitted from an organic light-emitting device, from circular polarized light into linear polarized light, or from linear polarized light into circular polarized light.

The retardation film may be formed of polyethylene terephthalate (PET) or tri-acetyl-cellulose (TAC). In this regard, the retardation film may be formed by rubbing a surface of a material film with a piece of velvet in order to give an orientation direction to the surface, coating liquid crystals thereon by using a coater, and drying the liquid crystal coating.

The retardation film may be formed of polyethylene terephthalate (PET) or tri-acetyl-cellulose (TAC). In this regard, the retardation film may be formed by coating a surface of a material film with an optical orientation layer, irradiating a laser onto the surface of the material film in order to give an orientation direction to the surface, coating liquid crystals thereon by using a coater, and drying the liquid crystal coating.

The color adhesive layer may include a first dye that absorbs a first light beam having a peak wavelength of about 470 to about 510 nm, a second dye that absorbs a second light beam having a peak wavelength of about 540 to about 610 nm, and a binder.

The color adhesive layer adheres an optical film to a base layer, or adheres the polarizing plate to an organic light-emitting device. The color adhesive layer is mainly formed of a binder material. For example, the color adhesive layer 130 may be formed of at least one binder material selected from the group consisting of an acryl-based polymer, a silicon-based polymer, an ester-based polymer, a urethane-based polymer, an amide-based polymer, an ether-based polymer, a fluor-based polymer, and a rubber. For example, the binder material may include an acryl-based polymer and a silicon-based polymer.

The color adhesive layer includes a first dye that absorbs a first light beam having a peak wavelength of about 470 to about 510 nm. As the first dye in the color adhesive layer absorbs the first light beam having a wavelength in the above range, the color adhesive to layer may have a lower transmittance of 50% or less with respect to the first light beam and a higher transmittance with respect to blue light and green light.

The first dye included in the color adhesive layer may be any dye that can absorb the first light beam having a peak wavelength of about 470 to about 510 nm. For example, the first dye may be at least one dye selected from the group consisting of an anthraquinone-based dye, a methine-based dye, an azomethene-based dye, an oxadine-based dye, an azo-based dye, a styryl-based dye, a coumarin-based dye, a porphyrin-based dye, a dibenzofuranone-based dye, a diketopyrrolopyrrole-based dye, a rhodamine-based dye, a xanthene-based dye and a pyrromethene-based dye.

In this regard, the first dye may be an anthraquinone-based dye.

As the first dye in the color adhesive layer absorbs the first light beam having a peak wavelength of about 470 to about 510 nm, the color adhesive layer may have an absorbance of about 50 to about 95% for the first light beam. If the color adhesive layer has an absorbance of about 50% or greater for the first light beam, visibility of dark colors of an image may not be degraded. If the color adhesive layer has an absorbance of 95% or less with respect to the first light beam, color reproduction characteristics of an organic light-emitting device may be improved.

In addition, the color adhesive layer includes a second dye that absorbs a second light beam having a peak wavelength of about 540 to about 610 nm. As the second dye in the color adhesive layer absorbs the second light beam having a wavelength in the above range, the color adhesive layer may have a lower transmittance of 50% or less with respect to the second light beam and a higher transmittance with respect to blue light and red light.

The second dye included in the color adhesive layer may be any dye that can absorb the second light beam having a peak wavelength of about 540 to about 610 nm. For example, the first dye may be at least one dye selected from the group consisting of an anthraquinone-based dye, a methine-based dye, an azomethine-based dye, an oxadine-based dye, an azo-based dye, a styryl-based dye, a coumarin-based dye, a porphyrin-based dye, a dibenzofuranone-based dye, a diketopyrrolopyrrole-based dye, a rhodamine-based dye, a xanthene-based dye and a pyrromethene-based dye.

In this regard, the second dye may be an azomethine-based dye.

As the second dye in the color adhesive layer absorbs the second light beam having a peak wavelength of about 540 to about 610 nm, the color adhesive layer may have an absorbance of about 50 to about 95% for the second light beam. If the color adhesive layer has an absorbance of about 50% or greater for the second light beam, visibility of dark colors of an image may not be degraded. If the color adhesive layer has an absorbance of 95% or less for the second light beam, color reproduction characteristics of an organic light-emitting device may be improved.

The color adhesive layer may have a thickness of about 10 μm to about 30 μm. If the thickness of the color adhesive layer is about 10 μm or greater, the color adhesive layer may be highly durable against impacts. If the thickness of the color adhesive layer is 30 μm or less, the polarizing plate including the color adhesive layer may have a slim panel structure.

Types and concentrations of the first dye, the second dye and the binder used for the color adhesive layer are not confined by light absorbable by the color adhesive layer.

As the color adhesive layer includes both the first dye and the second dye, and thus simultaneously absorbs the first light beam having a peak wavelength of about 470 to about 510 nm and the second light beam having a peak wavelength of about 540 to about 620 nm, the intensities of light emission at a crossing point of blue and green peak wavelengths and at a crossing point of green and red peak wavelengths may be lowered, and color purity and color reproduction characteristics of an organic-light emitting device may be improved.

The polarizing film, which has polarizing characteristics, may have a matrix structure. The polarizing film may further include iodine and a third dye. The matrix structure may be formed of polyvinylalcohol (PVA).

The polarizing film may include both the iodine and the third dye. When the polarizing film is formed by incorporating the iodine into polyvinyl alcohol, chains of iodine ions are oriented due to the chains of the polyvinyl alcohol that are oriented by drawing, thereby exhibiting polarizing properties. When polyvinyl alcohol contains iodine, the polyvinyl alcohol may have excellent polarizing efficiency and transmittance. However, due to the sublimation of the iodine, durabilities with respect to temperature, humidity, and light may degrade, thereby finally degrading uniformity of the polyvinyl alcohol.

When the polarizing film is formed by incorporating the third dye into polyvinyl alcohol, the third dye is oriented in the same manner as when using the iodine, due to the chains of polyvinyl alcohol that are oriented by drawing, thereby exhibiting polarizing properties. However, when polyvinyl alcohol includes such a dye, the polyvinyl alcohol may have excellent durability due to a lack of sublimating iodine. However, dichroism of the polyvinyl alcohol may be poor. In other words, when the polarizing film is formed by incorporating both the third dye, which provides excellent uniformity and durability, and the iodine into polyvinyl alcohol, insufficient uniformity of polyvinyl alcohol associated with the exclusive use of the iodine may be compensated for by the third dye.

The third dye may be any dye that may be used in the manufacture of dye-based polarizing films. For example, the third dye may be a dye having the following structure:

The weight ratio of the iodine to the third dye used in the polarizing film may be in the range of 1:1 to 1:1.5. If the weight ratio of the iodine to the third dye is within this range, uniformity and a degree of polarization may be excellent. The polarizing film may have a thickness of about 15 to about 30 μm.

The polarizing film has an absorption axis and a polarization axis. The absorption axis is an axis along which the chains of iodine ions and the third dye are extended by drawing. The absorption axis destructs one of two perpendicular components of light oscillating in arbitrary directions while electric energy of the light is converted to electronic energy by the interaction of the perpendicular component with electrons of the polarizing film. The polarization axis is an axis perpendicular to the absorption axis, and transmits light oscillating in the direction of the polarization axis.

The polarizing film may be manufactured by using a method of drawing a polyvinylalcohol film and then adsorbing the iodine and the third dye thereto, a method of adsorbing the iodine and the third dye to a polyvinylalcohol film and then drawing the polyvinylalcohol film, or a method of dyeing the iodine and the third dye to a polyvinylalcohol film while drawing the polyvinylalcohol film.

Furthermore, in order to protect the polarizing film, a first base layer and a second base layer may be further disposed to contact the polarizing film. The first base layer supports and protects the polarizing film, and enforces durability, moisture resistance, and mechanical strength of the polarizing film. The first base layer may be formed of a material having a high light transmittance and a comparatively low birefringence and that is apt to be hydrophilic via surface reformation. For example, the first base layer may be formed of tri-acetylcellulose. The first base layer may have a thickness of about 50 to about 100 μm for sufficient strength. The second base layer supports the polarizing film and protects the polarizing film from external impacts. The material and the thickness of the second base layer may be the same as those of the first base layer.

A polarizing plate according to another embodiment of the present invention may includes a polarizing film, a first base layer, a second base layer, a retardation film, and a color adhesive layer disposed between the polarizing film and the retardation film.

A polarizing plate according to another embodiment of the present invention may further include an adhesive layer. In this regard, the polarizing plate may have a stacked structure including the adhesive layer, a retardation film, a color adhesive layer, a first base layer, a polarizing film and a second base layer stacked in this order.

In another embodiment, the polarizing film may have a multi-layered structure including a first polarizing film and a second polarizing film, wherein the first polarizing film may include a matrix and iodine, and the second polarizing film may include a matrix and a third dye.

Figure 2:
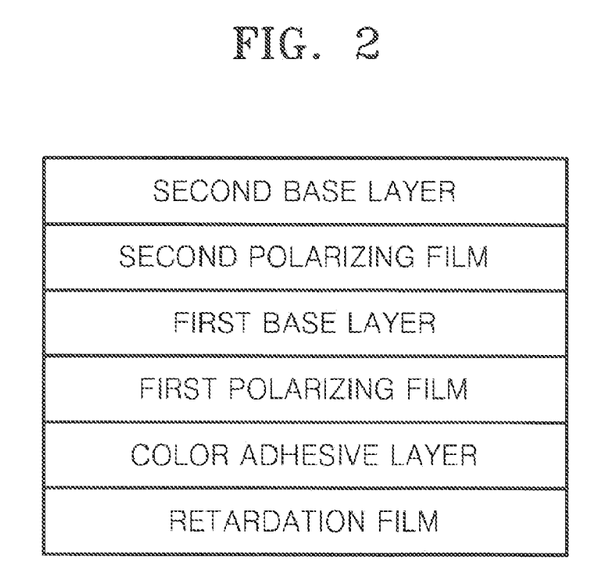
FIG. 2 is a cross-sectional view of a polarizing plate according to another embodiment of the present invention.

FIG. 2 is a cross-sectional view of a polarizing plate according to another aspect of the present invention.

Referring to FIG. 2, the polarizing plate according to the current embodiment of the present invention may include a first polarizing film, a second polarizing film, a first base layer, a second base layer, a retardation film, and a color adhesive layer disposed between the first polarizing film and the retardation film. The first base layer may be disposed between the first polarizing film and the second polarizing film. The second base layer may be disposed on a surface of the second polarizing film opposite to the first base layer.

The retardation film, the color adhesive layer, the first base layer and the second base layer are the same as those described with reference to FIG. 1. Thus, a detailed description thereof will not be provided here.

The first polarizing film, which has polarizing characteristics, may have a matrix structure. The polarizing film may further include iodine and a third dye. The matrix structure may be formed of polyvinylalcohol (PVA). A material and structure of the second polarizing film may be the same as those of the first polarizing film.

Due to the first polarizing film, the transmittance of the polarizing plate is increased, whereas the degree of polarization is lowered. Consequently, uniformity of visible light may be lowered. The second polarizing film may improve these drawbacks.

The polarizing plate may further include an adhesive layer. In this case, the polarizing plate may have a stacked structure including the adhesive layer, the retardation film, the color adhesive layer, the first polarizing film, the first base layer, the second polarizing film and the second base layer stacked in this order.

According to another aspect of the present invention, an organic light-emitting device includes a substrate on which an organic light-emitting element is disposed, and a polarizing plate located in an optical path of light emitted from the organic light-emitting element, wherein the polarizing plate may be the polarizing plate described above.

The organic light-emitting element includes a first electrode; a second electrode disposed opposite to the first electrode; and an organic layer disposed between the first electrode and the second electrode. For example, the organic light-emitting element may have a first electrode/hole injection layer (HIL)/emission layer (EML)/second electrode structure, a first electrode/HIL/hole transport layer (HTL)/EML/electron transport layer (ETL)/second electrode structure, or a first electrode/HIL/HTL/EML/ETL/electron injection layer (EIL)/second electrode structure. Alternatively, the organic light-emitting element may also have a first electrode/single layer having both hole injection and hole transport capabilities/EML/ETL/second electrode structure, or a first electrode/single layer having both hole injection and hole transport capabilities/EML/ETL/EIL/second electrode structure.

The first electrode may constitute an anode or a cathode. The substrate may be a substrate conventionally used in organic light-emitting devices, and may include, for example, a glass substrate or a transparent plastic substrate, which has excellent mechanical strength, thermal stability, transparency, surface planarity, handling convenience, and water resistance. Examples of the first electrode material include materials, such as indium tin oxide (ITO), indium zinc oxide (IZO), tin oxide ($SnO_2$), zinc oxide (ZnO), aluminum (Al), silver (Ag), and magnesium (Mg), which have excellent conductivity, and may form a transparent or reflective electrode.

The HIL may be formed of any known materials used to form a HIL. Examples of the HIL material include, but are not limited to, a phthalocyanine compound such as copper phthalocyanine, 4,4',4"-tris(3-methylphenylphenylamino) triphenylamine (m-MTDATA), N,N'-di(1-naphthyl)-N,N'-diphenylbenzidine) (NPB), TDATA, 2-TNATA, polyaniline/dodecylbenzenesulfonic acid (Pani/DBSA), poly(3,4-ethylenedioxythiophene)/poly(4-styrenesulfonate (PEDOT/PSS), polyaniline/camphor sulfonic acid (Pani/CSA), and (polyaniline)/poly(4-styrenesulfonate) (PANI/PSS).

The HTL may be formed of any known materials used to form a HTL. Examples of the HTL material include, but are not limited to, carbazol derivatives such as N-phenylcarbazol or polyvinylcarbazol, and amine derivatives having an aromatic condensed ring, such as NPB, N,N'-bis(3-methylphenyl)-N,N'-diphenyl-[1,1-biphenyl]-4,4'-diamine (TPD), and N,N'-di(naphthalene-1-yl)-N,N'-diphenyl benzidine ($\alpha$-NPD).

The EML may be formed using various known light-emitting materials, such as known hosts and dopants. Dopants used to form the EML may include either a fluorescent dopant or a phosphorescent dopant, which are widely known in the art. Examples of the host may include, but are not limited to, $Alq_3$, 4,4'-N,N'-dicarbazole-biphenyl (CPB), 9,10-di(naphthalene-2-yl)anthracene (AND), and distyrylarylene (DSA). Examples of well-known red dopants include, but are not limited to, platinum(II) octaethylporphyrin (PtOEP), $Ir(piq)_3$, $Btp_2Ir(acac)$, and DCJTB. Examples of known green dopants include, but are not limited to, $Ir(ppy)_3$ (ppy=phenylpyridine), $Ir(ppy)_2(acac)$, $Ir(mpyp)_3$, and 10-(2-benzothiazolyl)-2,3,6,7-tetrahydro-1,1,7,7-tetramethyl-1H, 5H,11H-(1)benzopyropyrano(6,7-8-i,j)quinolizine-11-on (C545T). Examples of well-known blue dopants include, but are not limited to, $F_2Irpic$, $(F_2ppy)_2Ir(tmd)$, $Ir(dfppz)_3$, ter-fluorene, 4,4'-bis(4-diphenylaminostyryl)biphenyl (DPAVBi), and 2,5,8,11-tetra-t-butyl pherylene (TBP).

The ETL may be formed of any known materials used to form an ETL. Examples of the ETL material include, but are not limited to, quinoline derivatives, such as tris(8-quinolinolate)aluminum ($Alq_3$), TAZ, and Balq.

The EIL may be formed of any known materials used to form an EIL. Examples of the EIL material include LiF, NaCl, CsF, $Li_2O$, BaO, and the like. The deposition or coating conditions for forming the EIL may be similar to those applied to form is the HIL, although the deposition and coating conditions may vary according to the material that is used to form the EIL.

The second electrode may constitute a cathode or an anode. The material for forming the second electrode may include a metal, an alloy, or an electrically conductive compound, materials which have a low work function, or a mixture thereof. Examples of such materials include lithium (Li), magnesium (Mg), aluminum (Al), aluminum-lithium (Al—Li), calcium (Ca), magnesium-indium (Mg—In), and magnesium-silver (Mg—Ag). In addition, in order to manufacture a top-emission organic light-emitting device, a transparent cathode formed of a transparent material such as ITO or IZO may be used as the second electrode.

An adhesive agent may be used to adhere the polarizing plate to the substrate of the organic light-emitting device. The adhesive agent may be a pressure sensitive adhesive (PSA). For example, an adhesive agent containing an acrylic copolymer that has a high elasticity coefficient and good adhesive characteristics and may suppress generation of fine air bubbles between the substrate and the adhesive layer to prevent separation of the adhesive layer. In addition to adhering the polarizing plate to the substrate, the adhesive agent enhances moisture resistance of the polarizing plate and has an elasticity to protect the polarizing plate from external impacts. The adhesive layer may have a thickness of about 15 to about 30 μm.

According to an embodiment of the present invention, assuming that an intensity of a first light beam having a peak wavelength of 470 to 510 nm emitted from the organic light-emitting element is A, and the intensity of the first light beam that has passed through the polarizing plate after being emitted from the organic light-emitting element is B, B/A×100 (%) may be equal to or less 50%. In addition, assuming that an intensity of a second light beam having a peak wavelength of 540 to 610 nm emitted from the organic light-emitting element is C, and the intensity of the second light beam that has passed through the polarizing plate after being emitted from the organic light-emitting element is D, D/C×100(%) may be equal to or less than 50%.

Hereinafter, one or more embodiments of the present invention will be described in detail with reference to the following examples. These examples are not intended to limit the purpose and scope of the one or more embodiments of the present invention.

EXAMPLE 1

A λ/4 retardation film was formed on a releasing film, and a color adhesive layer including an anthraquinone-based dye absorbing light having a peak wavelength of 475 nm and an azomethine-based dye absorbing light having a peak wavelength of 587 nm was then formed on the λ/4 retardation film to a thickness of 10 μm.

A first base layer was formed on the color adhesive layer by coating tri-acetyl-cellulose to a thickness of 50 μm, and a polarizing film including a polyvinylalcohol film, iodine and a dichroic dye was then formed on the first base layer to a thickness of 20 μm.

Finally, a second base layer was formed on the polarizing film by coating tri-acetyl-cellulose to a thickness of 50 μm.

EXAMPLE 2

A λ/4 retardation film was formed on a releasing film, and a color adhesive layer including an anthraquinone-based dye absorbing light having a peak wavelength of 475 nm and an azo-based dye absorbing light having a peak wavelength of 587 nm was then formed on the λ/4 retardation film to a thickness of 10 μm.

A first polarizing film including a polyvinylalcohol film, iodine and a dichroic dye was formed on the color adhesive layer to a thickness of 20 μm.

A first base layer was formed on the first polarizing film by coating tri-acetyl-cellulose to a thickness of 50 μm, and a second polarizing film including a polyvinylalcohol film, iodine and a dichroic dye was then formed on the first base layer to a thickness of 20 μm.

Finally, a second base layer was formed on the second polarizing film by coating tri-acetyl-cellulose to a thickness of 50 μm.

COMPARATIVE EXAMPLE 1

A λ/4 retardation film was formed on a releasing film, and a color adhesive layer including an azomethine-based dye absorbing light having a peak wavelength of 587 nm was then formed on the λ/4 retardation film to a thickness of 10 μm.

A first base layer was formed on the color adhesive layer by coating tri-acetyl-cellulose to a thickness of 50 μm, and a polarizing film including a polyvinylalcohol film and iodine was then formed on the first base layer to a thickness of 20 μm.

Finally, a second base layer was formed on the polarizing film by coating tri-acetyl-cellulose to a thickness of 50 μm.

Comparative Example 2

A λ/4 retardation film was formed on a releasing film, and a color adhesive layer including an anthraquinone-based dye absorbing light having a peak wavelength of 475 nm was then formed on the λ/4 retardation film to a thickness of 10 μm.

A first polarizing film including a polyvinylalcohol film and iodine was formed on the color adhesive layer to a thickness of 20 μm.

A first base layer was formed on the first polarizing film by coating tri-acetyl-cellulose to a thickness of 50 μm, and a second polarizing film including a polyvinylalcohol film and iodine was then formed on the first base layer to a thickness of 20 μm.

Finally, a second base layer was formed on the second polarizing film by coating tri-acetyl-cellulose to a thickness of 50 μm.

The polarizing plates manufactured according to Examples 1-2 and Comparative Examples 1-2 were attached to organic light-emitting elements, respectively, and the organic light-emitting elements were operated to measure a transmittance thereof with respect to light in different colors. The results are shown in Table 1. Current consumptions of the organic light-emitting elements including the polarizing plates of Example 1 and Comparative Example 1, respectively, were also measured (at 200 nit (0.300, 0.310) after the attaching of the polarizing plate). The results are shown in Table 2.

Figure 3:
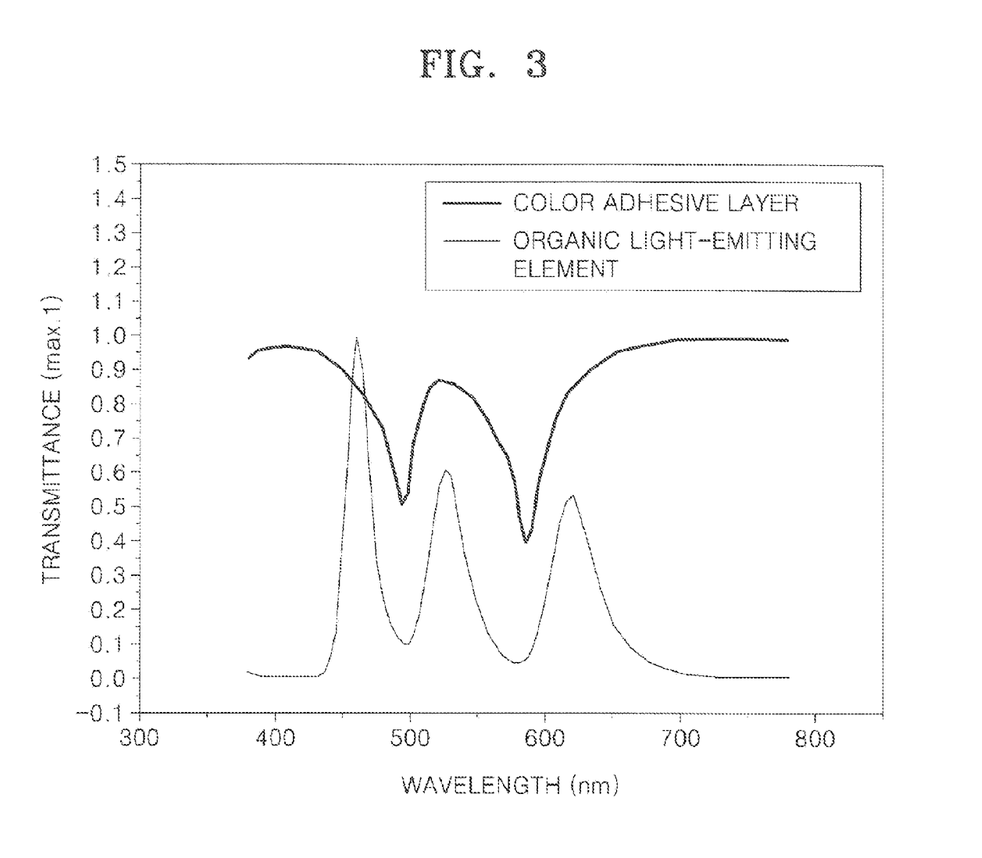
FIG. 3 is a graph of transmittances of an organic light-emitting element and a color adhesive layer according to Example 1.
Figure 4:
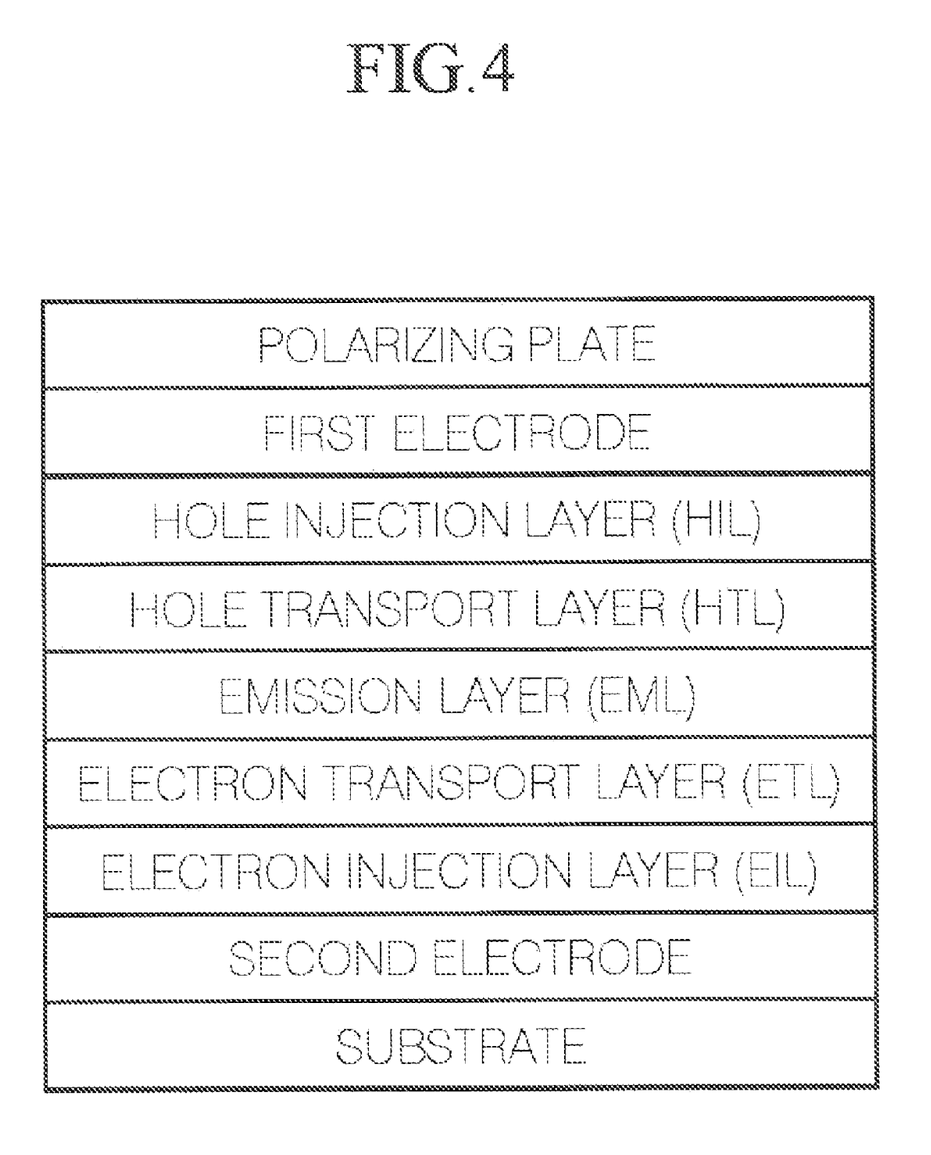
FIG. 4 is a cross-sectional view of an organic light emitting element on a substrate with a polarizing plate of the present invention in the optical path of light emitted from the organic light emitting element.

Transmittances of the color adhesive layer of Example 1 and the organic light-emitting element including the polarizing plate of Example 1 are shown in FIG. 3.

TABLE 1

Transmittance (%) of polarizing plates of Examples 1 and 2, and comparative Examples 1 and 2, for different colored light.

|  | Example 1 | Example 2 (%) | Comparative Example 1 (%) | Comparative Example 2 (%) |
|---|---|---|---|---|
| Red | 56.25 | 55.13 | 46.16 | 44.87 |
| Green | 54.71 | 53.22 | 44.27 | 42.68 |
| Blue | 51.87 | 51.01 | 43.29 | 42.11 |
| White | 55.18 | 54.05 | 44.74 | 43.54 |

TABLE 2

Current consumption of organic light emitting elements including the polarizing plates.

|  | Example 1 (milliampere) | Comparative Example 1 (milliampere) |
|---|---|---|
| Red | 33 | 43 |
| Green | 45 | 57 |
| Blue | 68 | 92 |
| White | 139 | 184 |

Referring to Table 1, a total transmittance of the organic light-emitting element including the polarizing plate of Example 1 was 55.18%, whereas that of the organic light-emitting element including the polarizing plate of Comparative Example 1 was 44.74%, indicating an increase of approximately 10.4% in the polarizing plate of Example 1.

Referring to Table 2, a current consumption of the organic light-emitting element including the polarizing plate of Example 1 was about 24.5% lower, as compared to that of the organic light-emitting element including the polarizing plate of Comparative Example 1. This is attributed to the increase in the transmittance of the light-emitting element including the polarizing plate of Example 1. Thus, a low power-consumption organic light-emitting display device may be implemented due to such a higher luminescent efficiency. Consequently, the organic light-emitting display device may operate at a lower current density, and thus may have a longer lifespan.

Referring to FIG. 3, the color adhesive layer of Example 1 had a transmittance of 80% or greater with respect to red light having a peak wavelength of 440 to 470 nm, green light having a peak wavelength of 510 to 540 nm and blue light having a peak wavelength of about 610 to 640 nm, and a transmittance of less than 50% with respect to peak wavelengths of 475 nm and 587 nm. Thus, when an organic-light emitting element including the color adhesive layer is applied to a mobile phone, so-called "black" characteristics of the mobile phone may be improved.

Such a transmittance of 80% or greater of the color adhesive layer with respect to red, green and blue light means that the color adhesive layer may minimize a loss of light recycled by a dual brightness enhancement film (DBEF) or cholesteric liquid crystals (CLC). In addition, since the color adhesive layer of Example 1 has a lower transmittance with respect to the wavelengths of 475 nm and 587 nm, which do not fall within the light emission spectra of organic light-emitting elements, a loss of light emitted from the organic light-emitting element is unlikely to occur, and the visibility of a displayed image is ensured without less effect of external light when the external light is initially incident or when the external light is externally emitted through the DBEF or CLCs after being reflected from an organic light-emitting element.

In addition, an organic light-emitting element according to an embodiment of the present invention including the high-transparency polarizing plate of Example 1 or 2 or a DBEF or CLC film for recycling light may have a higher transmittance. In addition, when including the color adhesive layer of Example 1 or 2, which specializes for display devices, the organic light-emitting device may ensure the visibility of a displayed image with less effect of external light.

The high-transparency polarizing plate according to the present invention may improve the visibility of a displayed image against external light and luminance, and may reduce power consumption.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A polarizing plate comprising:
a polarizing film;
a retardation film; and
a color adhesive layer disposed between the polarizing film and the retardation film,
wherein the color adhesive layer includes a first dye that absorbs light having a peak wavelength of about 470nm to about 510nm, a second dye that absorbs light having a peak wavelength of about 540nm to about 610nm, and a binder,
wherein the first dye comprises one or more dyes selected from the group consisting of an anthraquinone-based dye, a methine-based dye, an azomethine-based dye, an oxadine-based dye, an azo-based dye, a styryl-based dye, a coumarin-based dye, a porphyrin-based dye, a dibenzofuranone-based dye, a diketopyrrolopyrrole-based dye, a rhodamine-based dye, a xanthene-based dye and a pyrromethene-based dye, and
wherein the polarizing film comprises a matrix, iodine, and a third dye, wherein the third dye has one of the following structures:

2. The polarizing plate of claim 1, wherein the color adhesive layer has a transmittance of 50% or less for light having a peak wavelength of about 470 nm to about 510 nm.

3. The polarizing plate of claim 1, wherein the color adhesive layer has a transmittance of 50% or less for light having a peak wavelength of about 540 nm to about 610 nm.

4. The polarizing plate of claim 1, wherein the first dye comprises an anthraquinone-based dye.

5. The polarizing plate of claim 1, wherein the second dye comprises one or more dyes selected from the group consisting of an anthraquinone-based dye, a methine-based dye, an azomethine-based dye, an oxadine-based dye, an azo-based dye, a styryl-based dye, a coumarin-based dye, a porphyrin-based dye, a dibenzofuranone-based dye, a diketopyrrolopyrrole-based dye, a rhodamine-based dye, a xanthene-based dye and a pyrromethene-based dye.

6. The polarizing plate of claim 1, wherein the second dye comprises an azomethine-based dye.

7. The polarizing plate of claim 1, wherein the binder comprises one or more materials selected from the group consisting of an acryl-based polymer, a silicon-based polymer, an ester-based polymer, a urethane-based polymer, an amide-based polymer, an ether-based polymer, a fluor-based polymer, and a rubber.

8. The polarizing plate of claim 1, wherein the binder comprises an acrylbased polymer and a silicon-based polymer.

9. The polarizing plate of claim 1, wherein the polarizing film has a multi-layered structure including a first polarizing film and a second polarizing film, wherein the first polarizing film comprises the matrix and iodine, and the second polarizing film comprises the matrix and the third dye.

10. The polarizing plate of claim 1, wherein a weight ratio of the iodine to the third dye is in the range of 1:1 to 1:1.5.

11. The polarizing plate of claim 1, wherein the polarizing film has a thickness of about 15 μm to about 30 μm.

12. An organic light-emitting device comprising:
a substrate on which an organic light-emitting element is disposed; and
a polarizing plate of claim 1 located in an optical path of light emitted from the organic light-emitting element.

13. The organic light-emitting device of claim 12, wherein, the intensity of light having a peak wavelength between about 470nm to about 510nm emitted from the organic light-emitting element is A, and the intensity of the light that has passed through the polarizing plate after being emitted from the organic light-emitting element is B, and (B/A)×100(%) is equal to or less than 50%; and
the intensity of light having a peak wavelength of between about 540nm to about 610nm emitted from the organic light-emitting element is C, and the intensity of light that has passed through the polarizing plate after being emitted from the organic light-emitting element is D, and (D/C)×100(%) is equal to or less than 50%.

14. The polarizing plate of claim 1, wherein the first dye comprises an anthraquinone-based dye and the second dye comprises an azomethine-based dye.

15. A polarizing plate comprising:
a polarizing film;
a first base layer;
a second base layer;
a retardation film; and
a color adhesive layer disposed between the polarizing film and the retardation film,
wherein the color adhesive layer includes a first dye that absorbs light having a peak wavelength of about 470nm to about 510nm, a second dye that absorbs light having a peak wavelength of about 540nm to about 610nm, and a binder, and
the first base layer is disposed between the color adhesive layer and the polarizing film, and the second base layer is disposed on a surface of the polarizing film opposite to the first base layer.

16. The polarizing plate of claim 15, wherein the first base layer and the second base layer comprise tri-acetyl-cellulose (TAC).

17. The polarizing plate of claim 15, further comprising an adhesive layer, wherein the adhesive layer, the retardation film, the color adhesive layer, the first base layer, the polarizing film and the second base layer are stacked upon one another in this order.

18. A polarizing plate comprising:
a first polarizing film;
a second polarizing film;
a first base layer;
a second base layer;
a retardation film; and
a color adhesive layer disposed between the first polarizing film and the retardation film,
wherein the color adhesive layer includes a first dye that absorbs a first light beam having a peak wavelength of about 470 to about 510nm, a second dye that absorbs a second light having a peak wavelength of about 540 to about 610nm, and a binder, and
the first base layer is disposed between the first polarizing film and the second polarizing film, and the second base layer is disposed on a surface of the second polarizing film opposite to the first base layer.

19. The polarizing plate of claim 18, further comprising an adhesive layer, wherein the adhesive layer, the retardation film, the color adhesive layer, the first polarizing film, the first base layer, the second polarizing film and the second base layer are stacked upon one another in this order.

* * * * *